(12) United States Patent
Anthony et al.

(10) Patent No.: US 6,468,054 B1
(45) Date of Patent: Oct. 22, 2002

(54) CRAWL SPACE VENTILATOR FAN

(76) Inventors: Christopher L. Anthony, 54 E. Seventh St., Tracy, CA (US) 95376; Adrian M. Anthony, 54 E. Seventh St., Tracy, CA (US) 95376

( * ) Notice: Subject to any disclaimer, the term of this patent is extended or adjusted under 35 U.S.C. 154(b) by 0 days.

(21) Appl. No.: 09/430,671

(22) Filed: Oct. 28, 1999

(51) Int. Cl.[7] .............................................. F04B 17/00
(52) U.S. Cl. ...................................... 417/360; 454/239
(58) Field of Search .......................... 417/360; 454/236, 454/186, 341, 239, 252, 345, 368, 351, 68, 344; 165/248; 236/49.3, 49.5, 49.2, 44 A, 44 C; 439/485; 34/428

(56) References Cited

U.S. PATENT DOCUMENTS

| | | | |
|---|---|---|---|
| 2,580,797 A | * 1/1952 | Koch ........................... 454/350 |
| 3,479,947 A | * 11/1969 | Myers .......................... 454/344 |
| 4,175,480 A | 11/1979 | Beam, Jr. et al. |
| 4,247,989 A | * 2/1981 | Steffen ......................... 34/428 |
| 4,493,456 A | 1/1985 | Sarazen, Jr. et al. |
| 4,587,892 A | 5/1986 | Witten et al. |
| 4,699,045 A | 10/1987 | Hensley |
| 4,711,160 A | 12/1987 | Witten et al. |
| 4,821,628 A | 4/1989 | Sarazen, Jr. et al. |
| 4,877,182 A | 10/1989 | Pugh et al. |
| 4,953,450 A | 9/1990 | Remondino |
| 5,131,887 A | 7/1992 | Traudt |
| 5,230,719 A | * 7/1993 | Berner et al. ................. 96/144 |
| 5,253,804 A | 10/1993 | Sarazen, Jr. et al. |
| 5,294,049 A | 3/1994 | Trunkle et al. |
| 5,458,505 A | * 10/1995 | Prager ......................... 439/485 |
| 5,460,572 A | 10/1995 | Waltz et al. |
| 5,593,347 A | * 1/1997 | Mandy et al. ................ 454/68 |
| 5,655,478 A | * 8/1997 | Kiera .......................... 119/165 |
| 5,664,996 A | * 9/1997 | Wang et al. ................. 454/210 |
| 5,881,951 A | 3/1999 | Carpenter |
| 5,890,959 A | * 4/1999 | Pettit et al. .................. 454/184 |
| 5,921,862 A | * 7/1999 | Ucciardi ...................... 454/353 |

* cited by examiner

*Primary Examiner*—Teresa Walberg
*Assistant Examiner*—Quang Van
(74) *Attorney, Agent, or Firm*—Henneman & Saunders; Larry E. Henneman, Jr.

(57) ABSTRACT

A crawl space ventilator includes a molded plastic self-contained support frame 20, with low voltage fan(s) 40 mounted therein. The frame 20 including a screened face plate 14 with adjustable hooks 22 or other such means for attachment to existing crawl space screens 12. On the upper surface of the frame 20 is a sloping rain guard 24, molded into the frame 20, to direct rain or irrigation water off the unit and vertical perforated tabs 26 on either side, that can break, off to allow for adjustment to for the ventilator to fit different sized vent screen 12 sizes. The tabs 26 have a secondary purpose, in that they have holes 27 that allow for nails or screws to penetrate through the holes 27 and into the foundation wall surrounding the crawl space opening 12, and is intended as an alternative method for installation. The ventilator has protective screens 34 installed to the front of the fan(s) 40 and a solid vent cover 32 of molded ridged plastic attached by swivel points 30 on either side of the unit, at the top corners, allowing the vent cover 32 to move freely open when the unit is in operation, and to close, when not operating. The fan(s) 40 are low voltage, high efficiency, lightweight and durable and are positioned within the support frame 20 by means of mounts 28 molded into the support frame 20 corresponding to holes on the four corners of the fan(s) 40. On either side of the fan(s) 40, there is a space 42 molded into the housing created by inner walls 44 that slope towards the front of the support frame 20. These spaces create a venturi effect, by allowing a higher volume of air to be drawn through the ventilator.

5 Claims, 4 Drawing Sheets

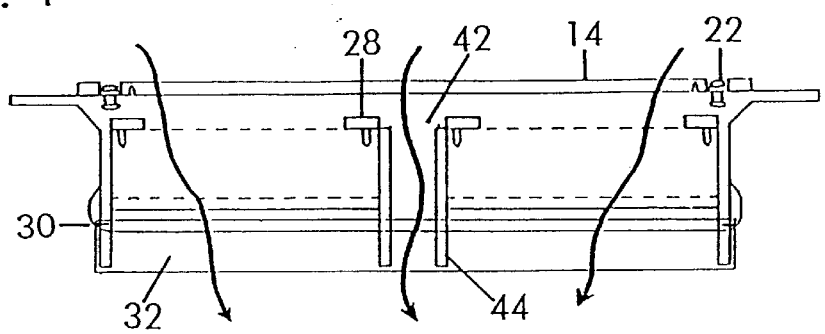
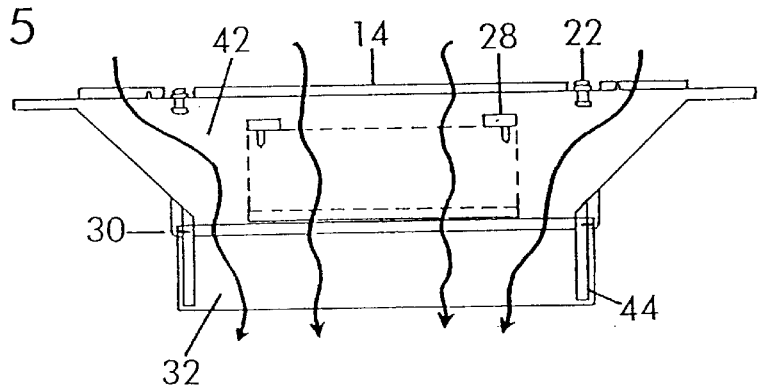
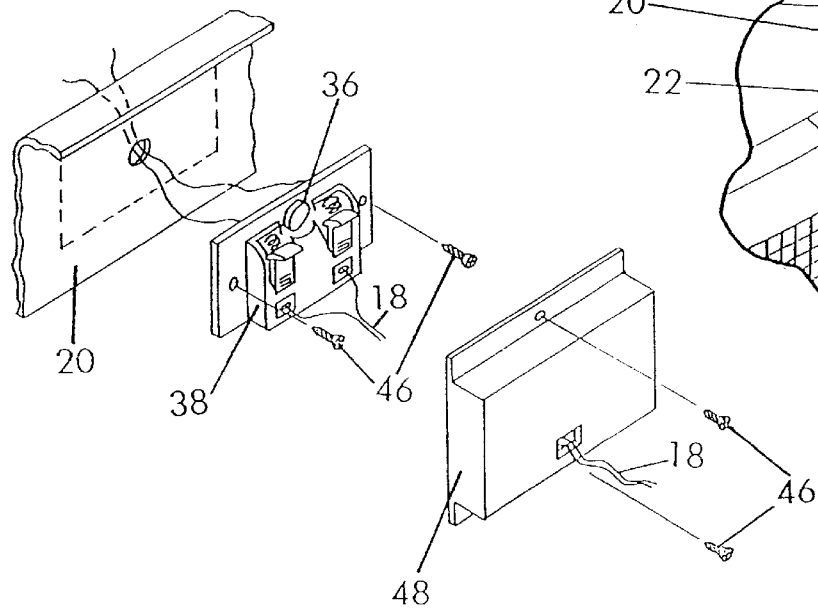
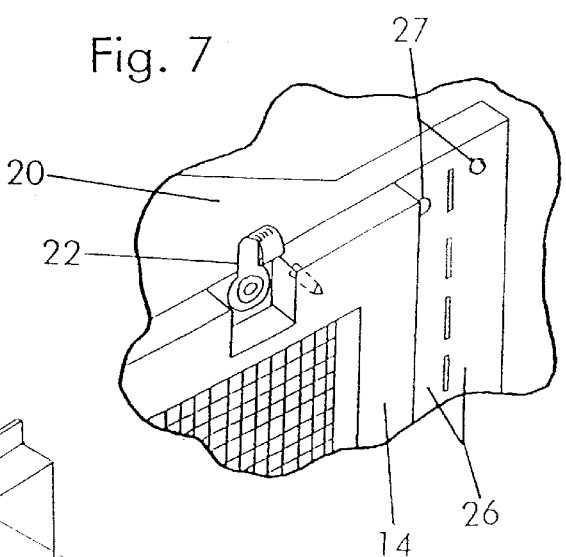

CRAWL SPACE VENTILATOR FAN

BACKGROUND—FIELD OF THE INVENTION

The present invention generally relates to a unit which exhausts air from the crawl space area of a dwelling or other building with a space below the sub-floor, and more particularly, relates to a ventilator with an improved installing and mounting means which is low voltage, thus having the ability to be wired through standard irrigation timers.

BACKGROUND—DESCRIPTION OF PRIOR ART

Many structures are built with underlying air space under the sub-floor, which for the sake of convenience, will be called crawl space for the purpose of this application. These crawl space areas can accumulate substantial amounts of moisture due to poor drainage of the soil, environmental factors such as rainfall and humidity, and even landscape irrigation. This excessive moisture, causes humidity to build and provides a breeding ground for mold, mildew and biological contaminants which are known to cause asthma as well as other severe allergic health problems. In fact, the Consumer Federation of America calls our sick houses the "number one health and safety issue of our time" adding billions of dollars annually to the nation's health bill. Contaminants under the subfloor build, and eventually permeate into the dwelling itself, causing air pollution inside. This indoor pollution is believed responsible for the huge increase in hospitalizations for Asthma—an increase of 50% for adults and 200% for children in the past 20 years. Not only does excessive moisture in crawl space areas under buildings lead to health problems, it also promotes rot and decay in the wood substructure and rust to any metal members, such as jackstands, support brackets, etc., costing billions in water damage repairs annually. Also, many naturally occurring gases and odors can occur under these buildings, and without the aid of a ventilator to allow them to escape, they can build to dangerous levels. Among the most dangerous of these gases is Radon, which is considered to be the most serious cancer causing agent in the environment. In combination, these contaminates can have synergistic effects, compounding the health risks further.

In many of these structures, particularly more recently built dwellings, there is a very low rate of air exchange between the air in the crawl space and the air outside the dwelling. This is due in part to recent trends towards high energy efficient construction. These practices involve the use of insulations to make the dwelling more tightly sealed, and sealing cracks and other air leaks to prevent heated or cooled air from escaping, and outside air which requires heating or cooling from randomly entering at an excessive rate. In effect, such houses and buildings become, to various degrees, closed systems. The result of an insufficient inlet fresh air volume flow rate into, and out of, such tight enclosed spaces is that contaminants accumulate inside to health affecting levels. To emphasize this point, it is estimated by some health care researchers that presently two persons per hour, in the United States alone, contract lung cancer as a result of contact with Radon in poorly ventilated houses and other buildings.

Most buildings with crawl space areas rely on passive air to circulate the air from inside the enclosed space under the sub-floor to the outside environment through openings in the foundation walls. Passive systems rely on environmental conditions, such as the wind, which is neither constant nor provides important exhaust air flow.

To deal with this problem, a number of ventilators have been created to assist in exhausting the air from the crawl space area through various methods. A search of existing Patents shows that numerous inventors have realized the need for a method to provide inlet fresh air to crawl space areas under dwellings and have proposed various systems, and methods of their use.

Many of these ventilator units, either the unit itself or it's housing, must be mortared in place in the foundation wall at the time it is constructed, and are therefore not suited for installation in a pre-existing situation, such as in existing constructions. Some of the ventilators are permanent installations, either the unit itself or its housing, and once installed, cannot be removed without the assistance of a person skilled in masonry techniques. Many of the ventilators require access underneath the sub-floor for installation. This requires a person the difficult and time consuming task of maneuvering in a crawl space area for the purpose of installing the ventilator, increasing the need for a professional. Other ventilators require permanent or "hard" wiring, requiring the skills of a professional electrician, further increasing the cost of installation.

Many of the ventilators in the prior art function on passive air flow and have no means for exhausting the air actively. These passive ventilators are designed with either a simple screen or a system of louvers that open and close to let air pass through. A number of ventilators were found to utilize either temperature sensing devices or humidity sensing devices, or both, causing an increase in manufacturing costs as well as creating a higher chance of unit malfunction due to the complexity of these devices. A few of the ventilators with a louver system were controlled to open and closed either with a solenoid or bi-metallic element, or temperature sensitive compression spring.

Following is a brief description of the prior art found in the patent search. There are ventilators that rely on a passive system to move air through as discussed above. These include U.S. Pat. No. 4,699,045 to Robert C. Hensley, Oct. 13, 1987 in which he discloses a thermostatically actuated ventilator with adjustable louvers and separate support frame that is to be frictionally mounted in an opening of a foundation wall.

Another passive system is that of U.S. Pat. No. 4,821,628 to Paul M. Sarazan Jr. and Dennis A. Beam Jr., Apr. 18, 1989 which discloses a shallow profile foundation ventilator consisting of a decorative molded frame with screening for mounting within an opening in a foundation wall, which is mostly intended for aesthetic purposes.

Another passive ventilator system discovered in the prior art is U.S. Pat. No. 4,274,330 to Alfred E. Witten and Howard W. Green, Jun. 23, 1981 in which is disclosed a ventilator with a separate mounting frame which said ventilator slides therein. This ventilator is also decorative, and mainly for appearances only.

A passive ventilator that must be permanently installed with mortar in a foundation wall during construction is disclosed in U.S. Pat. No. 5,460,572 to Arthur L. Waltz and David A. waltz, Oct. 24, 1995.

Disclosed in U.S. Pat. No. 4,493,456 to Paul M. Sarazan and Dennis A. Beam, Jan. 15, 1985, is another passive ventilator that includes a system of inter-connected louvers that open and close in response to a thermally responsive spring.

U.S. Pat. No. 4,175,480 to Dennis A. Beam Jr. and Paul M. Sarazan Jr., Nov. 27, 1979 discloses a passive ventilator with adjustable louvers with a support frame that connects to an opening in masonry walls.

In yet another invention, U.S. Pat. No. 4,290,554 to Robert C. Hensley, Sep. 22, 1981 discloses a temperature actuated foundation ventilator that also has a system of louvers controlled by a bimetallic element that responds to changes in temperature to move a control link that extends into the housing, into pivotal engagement to open and close said louvers. This ventilator is permanently installed with mortar into the foundation opening.

U.S. Pat. No. 4,587,892 to Alvin E. Witten and Erik H. Witten, May 13, 1986 discloses a passive ventilator in which it utilizes a compression spring to frictionally mount within a crawl space opening in order to keep the mounting frame secure as it contracts and expands in response to changes in temperature. It includes a shutter system that opens and closes in response to temperature changes.

A more simple passive design is that of U.S. Pat. No. 4,711,160 to Alvin A. Witten and Erik H. Witten, Dec. 8, 1987 which discloses a two piece ventilator consisting of a mounting cover frame and a shutter support housing which is frictionally mounted in the crawl space opening.

As mentioned above, passive ventilator systems rely on adequate air pressure or wind in order to be effective. This poses several problems, the first being that a constant source of said pressure is impractical and will rarely occur naturally. Also, many structures with crawl space areas have openings constructed within the surrounding foundation wall that, without the aid of one of those above mentioned ventilators, act as a passive system by themselves, and seemingly eliminate the need to add expensive and redundant additional passive systems.

In conclusion, in order to actively ventilate the air from a crawl space to the outside environment, it becomes obvious that the need to incorporate some sort of powered means to exhaust the air is essential in successfully ventilating such an area. In pointing this out, a number of existing ventilators are found that realize this need and are described as follows.

U.S. Pat. No. 5,294,049 to Timothy J. Trunkle et. al. , Mar. 15, 1994 discloses a temperature responsive louver housing ventilator with a fan controlled by a bi metallic element. This patent is designed to pull air from locations obstructed from direct air flow by incorporating the use of a flexible elongated duct that is mounted to the subfloor joicing along with a flexible adaptor hood to connect the ducting to the ventilator unit. By localizing where the air is drawn from, ventilation becomes limited and installation difficulty is compounded with the use of a duct that must be physically mounted under the subfloor. This ventilator also requires hardwiring and it is frictionally mounted within the crawl space opening.

U.S. Pat. No. 5,253,804 to Paul M. Sarazan et. al., Oct. 19, 1993 also incorporates the use of louvers and a temperature and humidity controlled fan in their ventilator design. This particular ventilator requires the skills of a professional to install in that it must be hard wired to the dwelling's main power source.

Another patent which uses louvers and temperature and humidity sensors is U.S. Pat. No. 5,881,951 to Peter W. Carpenter, Mar. 16, 1999 which also incorporates the use of a computer device that interprets information from temperature and relative humidity sensors and, in turn, adjusts and controls activation of the fan.

Other inventors have used alternative methods as actuators of their ventilators, such as a photocell, which senses outdoor light changes in connection to activating the ventilator. This component is utilized in U.S. Pat. No. 4,953,450 to Paul D. Remondino, Sep. 4, 1990, which discloses a ventilator that is to operate at a predetermined time interval, after sundown and before dawn. This method limits the time in which the unit is in operation and, does not take advantage of humidity or other environmental factors during the day.

Another ventilator which uses a different approach to activating,the fan is U.S. Pat. No. 4,877,182 to Robert J. Pugh et. al., Oct. 31, 1989 in which is disclosed a two piece ventilator system, having an intake unit and an exhaust unit, which are operated by a solenoid which in turn activates the louvers and fan. In this patent, the exhaust unit incorporates the use of a remote humistat and a fan, and the intake unit utilizes no source for active air flow, such as a fan, but does utilize a temperature sensing device. This poses a problem in that there is only active air flow on the exhaust unit, thus forcing this unit to perform the task of active ventilation on its on. This ventilator is too complex, utilizing a number of elaborate components. Its method of installation and wiring are not described, only the method of operation.

One invention found in the prior art deals specifically with the issue of gases. U.S. Pat. No. 5,131,887 to John E. Traudt, Jul. 21, 1992 discloses an inlet fresh air system which has an adjustable air flow rate and is activated in response to soil gas pressure. It incorporates the use of a ducting system that must be installed under a building's sub-floor, and uses a blower to move the air. It does not act as a ventilator, but conversely, draws air into the crawl space area.

My own invention seeks to exploit the use of active air flow, by having the ability to use a number of ventilator units, allowing for custom ventilation and to increase the rate of air exchange through the crawl space air, ensuring adequate expulsion of harmful toxins and contaminants. In so far as we are aware, the patent documents identified in the proceeding paragraph, disclose ventilators which are either passive, or require permanent installation in the foundation wall or under the subfloor, or utilize louvers, temperature or humidity sensors and other complex components that increase production costs and risks of mechanical failure.

We have now invented, and disclose herein, a molded plastic crawl space ventilator which is similar to those heretofore proposed, in that it forcibly removes air from beneath a dwelling's crawl space area and installs into an opening in a foundation wall. Our novel crawl space ventilator varies from those heretofore proposed, in that it is not permanently installed into mortar, and is not permanently attached to the screen in the vent opening or existing passive ventilator covers commonly found in most foundations, be they mortar or brick, finished with stucco, concrete, wood siding, etc. Further, the crawl space ventilator may be made from any convenient moldable, paintable plastic, uses a minimum of materials, is lightweight, and eliminates the need for complex components, such as temperature or humidity sensors, louvers and methods for controlling such louvers. The ventilator of this invention also utilizes pre-existing high efficiency low voltage fan(s), giving it the ability to be connected to standard irrigation or landscape lighting timers, further increasing its convenience and extending the capabilities of such systems.

Objects and Advantages

Objects of the present invention include providing a crawl space ventilator:

Which actively expels air from a crawl space area to the outside environment

Which utilizes a minimum of plastic material

Which reduces installation costs

Which installs non permanently to existing vent screens permitting relocation to alternate openings in the foundation, allowing for custom ventilation depending on individual circumstances Which can assist heating and air conditioning by drawing in cool night air in summer and warm day air in winter Which utilizes pre-existing high efficiency, low voltage fan(s)

Which avoids the use of complex components, such as temperature and humidity sensors, louvers, etc.

Which does not require hardwiring, instead relying on low voltage fan(s), thus having the ability to be connected to pre-existing irrigation or landscape lighting timer/transformer, expanding the capability of theses systems by including a ventilation station to their network, and also eliminating the need for additional timer systems.

Which can be directly connected to a standard transformer

Additional objects and advantages of the invention will be set forth in part in the description which follows, and in part will be obvious from the drawings, or may be learned from the practice of the invention.

BRIEF DESCRIPTION OF THE DRAWINGS FIGURES

FIG. 1 is a side view of the ventilator installed within a crawl space opening on a screen;

FIG. 2 is an isometric exploded view of dual-fan embodiment of ventilator;

FIG. 3 is an isometric view of single fan embodiment of ventilator;

FIG. 4 is a top view of dual- fan embodiment of ventilator;

FIG. 5 is a top view of single fan embodiment of ventilator;

FIG. 6 is an isometric view showing detail of push connector and cover and method of attachment to underside of ventilator;

FIG. 7 is an isometric view showing detail of hooks and rear screen and their methods of attachment;

FIG. 8 is a schematic illustration of a preferred method of how electrical power is connected.

REFERENCE NUMERALS IN DRAWINGS 10 foundation wall
12 crawl space opening with vent screen
14 screened face plate
18 low voltage insulated wiring
20 support frame
22 adjustable hook
24 rain guard
26 perforated spacer/mounting tabs
27 hole
28 fan mount
30 swivel point
32 vent cover
34 framed screen
36 rectifier
38 push connector
40 12V or 24V DC brushless fan
42 venturi space
44 venturi wall
46 ⅜" screw
48 connector cover

DESCRIPTION OF THE DRAWINGS

This unit is to be built with the support frame 20 incorporating a rain guard 24 and made of molded plastic as a single unit. (The molded plastics used to create the ventilator will preferably be paintable, so that the ventilator may be painted to match existing colors on a dwelling for the purpose of make it less conspicuous and more attractive). The support frame 20 is generally rectangular, with horizontal bottom and top walls and vertical side walls and open therethrough. On the back of the support frame 20 is a screened face plate 14. The right and left sides of the support frame 20 taper inward and toward the front of the ventilator.

The ventilator may utilize either one or two box fans 40 as will be described in the preceding section and as are depicted in the drawings (FIGS. 2 and 3). Depending on which embodiment of the ventilator, there are to be vertical walls 44 within the support frame juxtaposed to either side of the fan(s) 40 which taper wider at the bottom towards the front of the ventilator, and away from the bottom horizontal wall. These walls 44 create open spaces 42 next to the fan(s) 40 and at the bottom front of the ventilator allowing an increased amount of air to be drawn through the ventilator.

Figure 1:
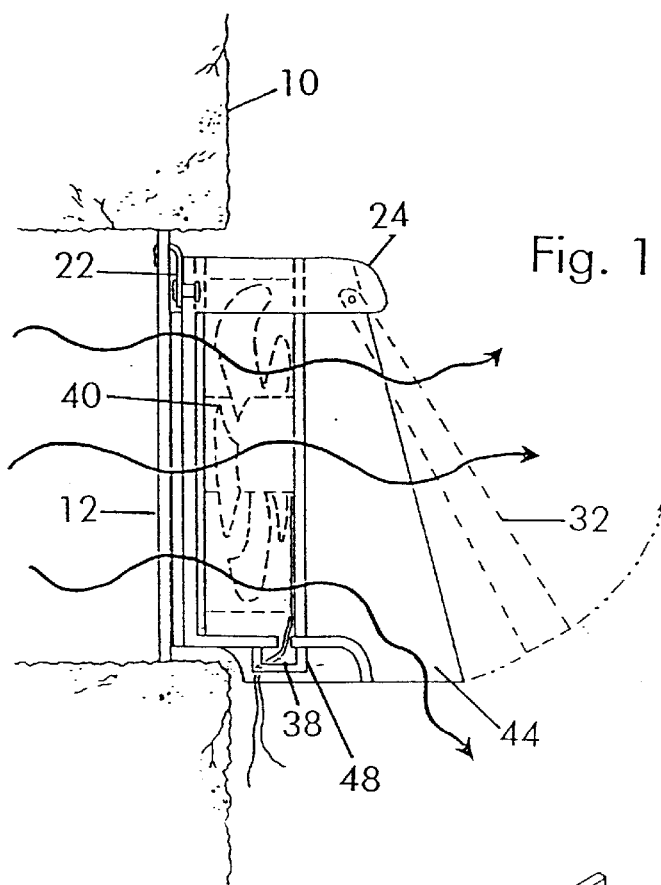
Figure 3:
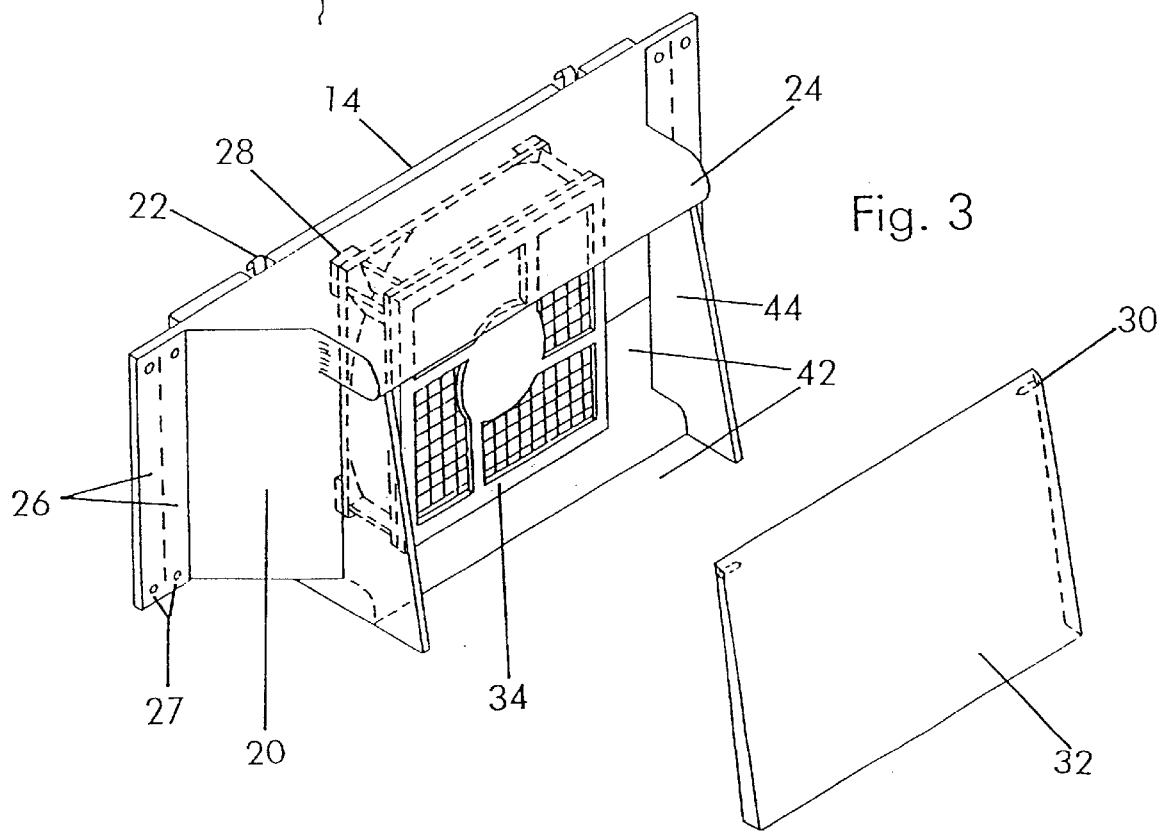

Both the top and bottom horizontal walls of the support frame 20 have a downward sloping curve on their front edge. The curved edge on the upper horizontal wall acts as the molded in rain guard 24, preventing rain or irrigation water from entering the ventilator. The curved edge on the bottom horizontal wall, also prevents moisture intrusion under the ventilator and provides a space underneath in which the low voltage wiring 18 of the fan(s) 40 is connected to a push connector 38.

The top rear edge of the support frame 20 has flanges towards the left and the right of the center point of the ventilator. Installed through the flanges are adjustable hooks 22 to allow for attachment to a standard vent screen 12. (See FIG. 7).These hooks 22 are made of a rigid material such as metal and are mounted through the flanges on the support frame 20 by means of rivets, and are non-fixed, so as to rotate freely to allow for movement and adjustment for easy and convenient attachment to an existing crawl space screen 12.

On the edges of the support frame 20 are vertical perforated tabs 26 that allow for sections of the right and left sides of the support frame 20 to be broken off to adjust the size of the support frame 20 fit into different sized of the crawl space openings 12. At the top and bottom of each tab 26 is a hole 27, allowing for an alternate method of installing the ventilator by means of nails or screws driven through these holes 27 and into the outer perimeter of the crawl space opening 12.

Figure 2:
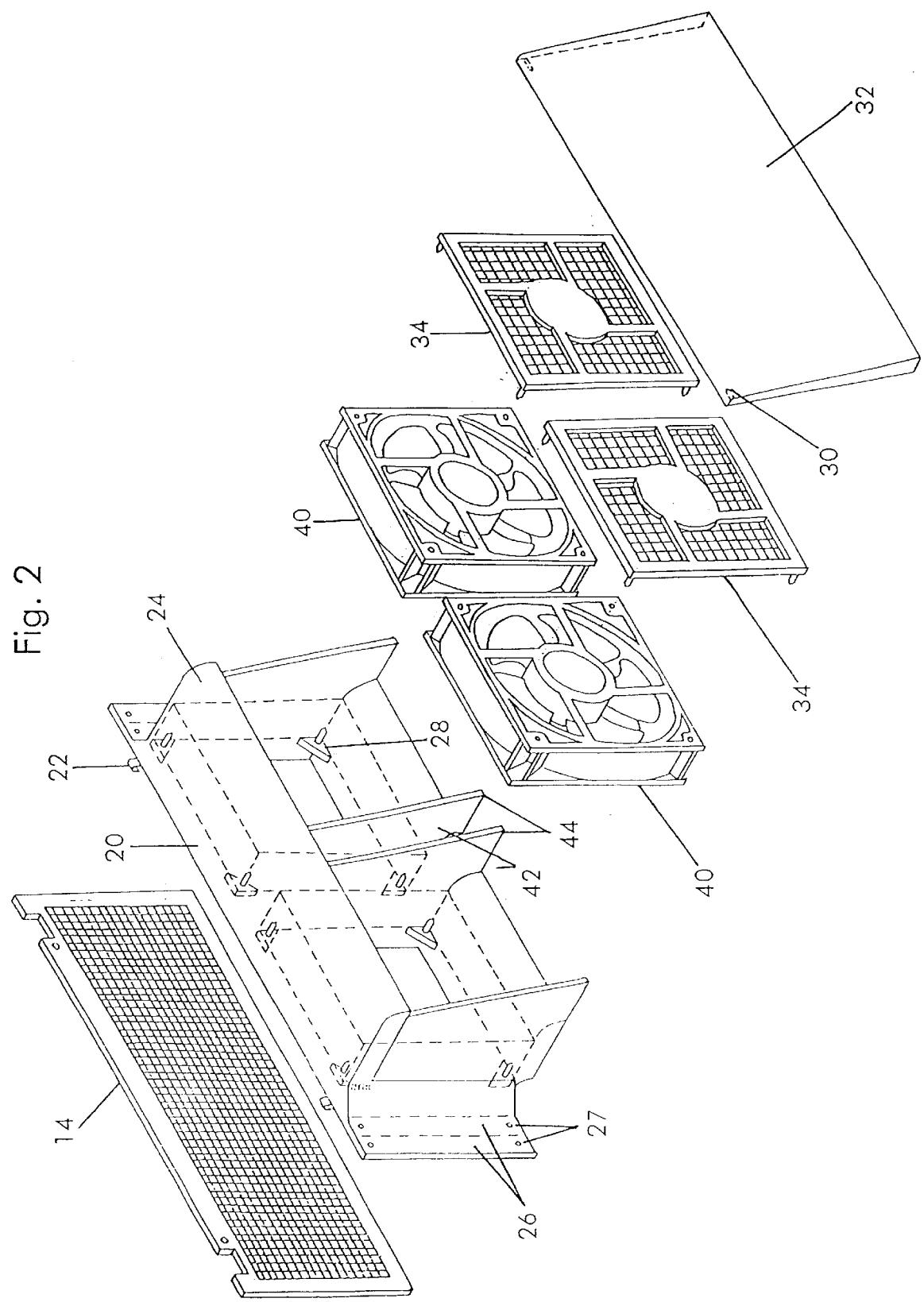
Figure 8:
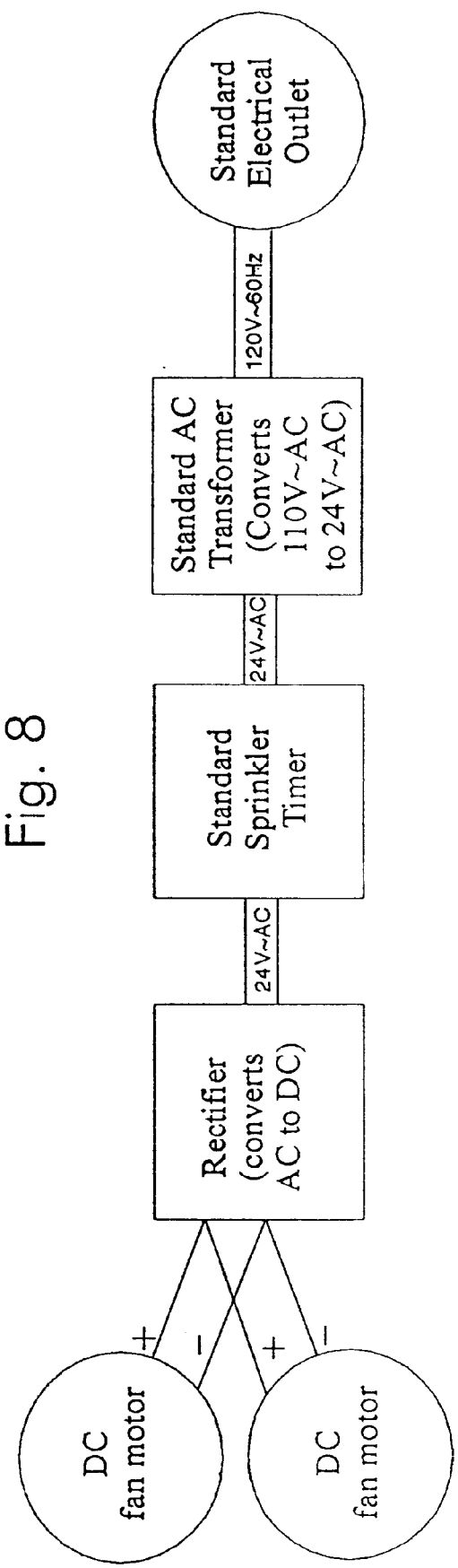

Within the support frame 20 are pre-molded fan mounts 28 that contain protrusions that are cylindrical in shape, with a conical end point, which connect to corresponding holes in the fan(s) 40. There is a fan mount 28 for each corner of the fan(s) 40 allowing the box fans 40 to be popped and locked into the support frame 20. (See FIG. 2).

Each fan 40 is pre-wired with connector, which in turn connects into central solderless push connector 38 located centrally underneath the bottom horizontal wall of the support frame 20. The push connector 38 is installed to the underside of the ventilator by means of two ⅜ inch screws 46. The push connector 38 will have a rectifier 36 to convert the voltage of the DC fans 40 to AC, which is the standard for household electric. There is a connector cover 48 which is rectangular in shape, and slightly larger than the push connector 38, that attaches to the underside of the bottom horizontal wall and over the push connector 38 by means of two ⅜ inch screws 46 for protecting the connector 38 from moisture or other potential damage. (See FIG. 6).

Each fan 40 has a screen 34 attached over its frontside, and the back of the support frame 20 will have a screen 14 attached over its opening. These screens 34, 14 are for the purpose of preventing debris or small animals or human hands from entering the unit. The screens 34, 14 are mounted in a lightweight plastic frame that is connected to their corresponding components by way of protrusions, similar to those of the fan mounts 28, and which pop into corresponding holes on the corners of the fan(s) 40 and the face plate screen 14.

A vent cover 32 that is roughly the length and width of the opening on the front of the support frame 20 at the top will be made of molded plastic. It attaches by means of molded protrusions 30 on the inside upper corners of the vent cover 32 which pop into corresponding holes located on the upper corners of the support frame 20 and under the lip of the rain guard 24. The rain guard 24 in conjunction with the vent cover 32 further prevent rain/irrigation from entering the unit. The attachment points 30 of the vent cover 32 to the support frame 20 will be non-fixed, allowing the vent cover 32 to pivot from its top, to swing freely opened and closed over the front opening of the support frame 20.

Description—Main Embodiment

This invention pertains to a low voltage ventilator fan to be installed on standard vent screens 12 on houses to aid in ventilation of crawl space areas under these homes. It is to be used on homes with raised floors with crawl space areas, assisting the normally passive air flow system. The purpose of this crawl space ventilator is to assist in removing mildew and fungal laden air and naturally occurring gases, such as Radon, and animal odor from under homes and in doing so, create a dryer environment under the home and prohibiting health risks and structural damage associated with excess moisture.

This ventilator will be comprised of a support frame 20 that on the back side contains evenly spaced adjustable hooks 22 to allow easy attachment to existing crawl space vent screens 12, or previously installed passive ventilator screens. As an additional method for installation, there are holes on the upper and lower portions of spacer tabs 26, that allow for either nails or screws to penetrate through and into the foundation wall surrounding the crawl space opening. The support frame 20 will be made with a sloping rain guard 24 on the upper surface to direct rain water or irrigation off the unit. The right and left sides of the support frame 20 will have vertical perforated tabs 26 that can break off to allow for adjustment to different size vent screens 12.

In one embodiment, one fan 40 is utilized within the support frame 20, having open spaces 42 on either side of the centrally placed fan 40. The single fan ventilator embodiment allows the ventilator to be more cost productive. In another embodiment, two fans 40 are utilized within the support frame 20 with an opening in between the two fans 40. The double fan ventilator embodiment allows for increased air flow. In either embodiment, the open space(s) 42 allow a greater volume of air to pass both through the fan(s) 40 and the open spaces, by drawing more air through the ventilator than through the fan(s) 40 alone. By increasing the air flow ratio, a venturi effect is created, increasing the ventilation performance.

On either side of the fan(s) 40, molded into the support frame 20 are vertical walls 44 that are wider at the bottom of the frame 20 than at the top. These walls 44 act as the walls for the venturi space 42, both next to the fan(s) 40 and at the front bottom of the support housing 20. These walls 44 additionally add structural strength to the support frame 20 itself The fan(s) 40 are installed within this space created by the upper and lower horizontal sides of the support frame 20 and the vertical venturi walls 44 within the frame 20. The fans 40 mount into the fan mounts 28 by means of a protrusion on the fan mount 28 which projects into preexisting holes located on the corners of the fan(s) 40. The front of each fan 40 is covered with a protective screen 34 which installs by a similar method. On the front of the ventilator is a vent cover 32 attached by means of swivel points 30 to the upper right and left corners of the frame 20, allowing the vent cover 32 to move open freely from air flow when the unit is in operation. The vent cover 32 is basically rectangular in shape with small right and left sides that curve back to the contours of the side of the ventilator support frame 20.

The fan(s) 40 are standard box fans used in electronic equipment for cooling and are small, lightweight, durable, inexpensive and rated for over 10,000 hours of use. They are extremely efficient and high powered moving over 125 cubic feet per minute and drawing less than 20 watts. In combination as described within this ventilator, the fans can move over 250 cubic feet of air. The fans can exchange the air under an average home every 10–15 minutes. These type of fans are easily obtainable through electronic equipment suppliers and wholesalers. Some of the features of these fans are described above. The advantages to utilizing these already existing fans are numerous. They are mass produced and are relatively inexpensive. Because there are numerous fans of this type available, the cost to manufacture this unit will be greatly reduced, as well as the fact that they are easily replaceable, should the need arise for replacement, due to failure, defect or exhaustion.

The fan unit 40 is connected with low voltage insulated wiring 18 to a push connector 38 which incorporates a rectifier 36. The rectifier 36 converts the incoming AC voltage to the DC voltage of the fan(s) 40. The push connector 38 connects the wiring 18 either directly to a standard transformer or through commonly found irrigation or landscape lighting timer which has transformer incorporated into its system. The transformer acts to convert the 110v of a standard electrical outlet to the either 12V or 24V of the fan(s) 40, (depending on the voltage in the fan being used). The transformer is plugged into any local standard electrical outlet on the structure for which this ventilator is to be installed on.

This ventilator incorporates the use of a low voltage electrical power source (i.e. transformer) as in those of standard outdoor landscape lighting or irrigation timers. Because the ventilator is low voltage, local building permits and persons skilled in the art will not be needed for installing permanent localized wiring, increasing the ease and convenience of installation by the homeowner. The ventilator connected through a timer controller can also assist heating and air conditioning systems by pulling in cool night air during summer, or drawing warm day air during winter.

This ventilator can connect to a standard transformer, with or without the aid if a standard timer, or preferably, can be connected directly to existing lighting or irrigation timers that include the appropriate transformer, saving the consumer the cost of new transformer and timer. Additional ventilators can be installed initially, or as the need arises, for the homeowner to improve or customize their ventilation systems.

Operation—Main Embodiment

Having described this invention in detail, the operation of the entire method and system and apparatus should be apparent. The ventilator may be used singly, on one existing crawl space opening on a particular dwelling, or preferably, plurally, with more than one ventilator installed on a number of crawl space openings about a given dwelling's foundation. The more ventilators utilized in a given circumstance increases the rate of air exchange, increasing the benefits of the same.

The ventilator is attached to existing vent screens in crawl space openings 12, or existing passive ventilator cover screens, such as those passive systems identified in the prior art, by means of adjustable hooks 22 which hook through individual openings on the screen 12. The hooks 22 swivel to the left and right to allow for some adjustment depending on the type of screen material. It is noted that most crawl space openings 12 contain some version of screens, however if there is an instance where no screen is evident in a particular crawl space opening, a new screen may be obtained at most local or chain hardware stores and installed relatively easily and quickly. Also, this ventilator may be attached by the alternate method, using screws or nails, fastened through holes 27 at the corners of the ventilator, and directly into the foundation wall surrounding the crawl space opening.

The convenient and quick installation of the ventilator enables the average person to remove and relocate the ventilator(s) at any given time, for the purpose of changing the ventilation system in order to customize the effects depending on weather, moisture, problem areas, etc.

With the ventilator installed onto the existing crawl space screen 12, the low voltage wiring 18 that runs from the fan(s) 40, through the push connector 38 and rectifier 36 and out through a transformer existing within a common irrigation or landscape lighting system, and is then connected directly to existing local 110v electrical outlet.

With the ventilator connected to it's desired power source, it is activated and air is drawn through the ventilator by means of the fan(s) 40 from under the existing structure, through the crawl space opening 12 and to the outside environment. The vent cover 32 on the front of the ventilator is thus opened as a result of this air flow. The vent cover 32 falls naturally closed, resting on the leading edge of the venturi walls 44, when the ventilator is not in operation, keeping the ventilator protected from water or other unwanted elements from entering. Because there are open spaces 42 at the bottom, front of the ventilator, air can still passively move through, even when the fan(s) 40 are not operating and the vent cover 32 is in its closed position.

The ventilator(s) should preferably be connected to some type of timer device, such as those mentioned above or other device of this type commonly found in many hardware stores. The use of the timer allows for custom timing of when the ventilator will operate, such as mentioned earlier, to aid in assisting heating and cooling, or off at night, on during the day. The factors of operating schedule are to be determined on an individual basis, based on such factors as humidity, season, soil moisture and other relevant data.

Description and Operation—Alternative Embodiments

There are several alternative forms the ventilator can take on, and in no way should be limited to those mentioned above. For example, because this ventilator is a low voltage system, it could be powered by solar cells. Also, the embodiment with two fans could include additional venturi spaces on the far left and right of the ventilator, as well as in between. Another option is making it possible for the fans to be installed backwards, thus creating an intake air flow, increasing the ventilation potential, however this concept would probably require replacing the vent cover with a system of louvers. It is obvious that the design of this ventilator could include louvers, especially in the case of climates where there is high humidity, and no air flow at all is desired from time to time. It also could incorporate such devices as temperature and humidity sensing devices, to allow stricter control of operation, although it is not preferred, as we believe some type of programmable timing device is sufficient. Although this ventilator is described as utilizing a rectifier within the push connector for the purpose of converting standard electrical AC current to the DC current of the fans, it is possible to eliminate this feature if a DC transformer or fan(s) is used. Although this ventilator is preferably made of molded plastic, changes in the materials used could be made, for example aluminum, because it is also rigid lightweight and rust resistant. Certain changes can be made in the methods in which the fans, screens, and vent cover are attached. Also, the hooks could be spring loaded, or standard "S" hooks could be used, or the same effect achieved with different methods, without changing the basic principles in function of this ventilator. Also, there have been recent building codes requiring the inclusion of vent openings on the eaves of new constructions, to permit ventilation of attic or roof truss areas. This ventilator could be adapted to be installed in these situations, quite easily and satisfactorily, providing important exhaust ventilation to these areas.

Conclusions, Ramifications and Scope

Accordingly, the reader will see that the crawl space ventilator of this invention can be used to exhaust air from underneath a dwelling to the outside environment, can be installed quickly and easily and is low voltage.

In addition, because the ventilator is not permanently installed, it can be easily removed and relocated, increasing the ability to customize the ventilation system to changing individual ventilation needs of any given situation. Furthermore, the ventilator has the additional advantages in that It permits the average person, not skilled in masonry techniques or electrical wiring, to install the ventilator, eliminating the need of the skills of different professionals and costs charged for their services.

It allows for a low voltage power source to run the fans, eliminating the need for complex wiring, building permits, or risks associated with high voltage wiring.

It provides a high efficiency, inexpensive method of exhausting dangerous levels of moisture, gases, mold, mildew, fungus and other contaminants from under a dwelling, helping to decrease, or even prevent, associated health risks and structural damage.

It has the ability to be connected to existing irrigation or landscape lighting timer/transformers, increasing the convenience of installation and allowing for custom control of the ventilator.

It uses a minimum of materials and molded pieces, decreasing the manufacturing costs.

It can be used a single unit, or in combination, increasing the ventilation potential.

From the foregoing detailed description of the preferred embodiments of the invention, it can be seen that the improved ventilator construction of the present invention may be utilized in existing openings of foundation walls of new constructions or in existing constructions, including those with existing passive ventilators that include a screen therein, and may be installed therein in a simple, convenient and quick manner, without the necessity of securing the ventilator with mortar or requiring hard wiring of the ventilator to a central power source or requiring access underneath a building for installation as is generally the case with relative prior art foundation ventilators.

Having hereby disclosed the subject matter of this invention, it should be obvious that many modifications and substitutions and variations of the present invention are possible in light of the teachings. For example, the ventilator can have other shapes, the hooks could be clamps, the vent cover could be attached with a 'living hinge' and molded in the same piece as the support frame, it could be powered by solar cells because of the low voltage, etc. It is therefore to be understood that the invention may be practiced other than as specifically described, and should be limited in breadth and scope only by the claims.

What is claimed is:

1. A ventilator for ventilating a crawl space of a building, through an opening defined by a wall of said building, said ventilator comprising:
    a frame adapted to mount to said building at said opening from outside said building, said frame including at least one screen engaging extension for engaging a screen disposed in said opening, whereby said frame is at least partially supported by said screen; and
    a low voltage fan fixed to said frame, for moving air through said opening.

2. A ventilator according to claim 1, wherein said at least one screen engaging extension comprises a hook.

3. A ventilator for ventilating a crawl space of a building, through an opening defined by a wall of said building, said ventilator comprising:
    a fan; and
    mounting means for mounting said fan to a screen fixed in said opening from outside said building.

4. A ventilator according to claim 3, further comprising power supply means for providing electrical power to said fan from outside said building.

5. A method for ventilating the crawl space of a building, through an opening defined by a wall of said building, said method comprising:
    mounting a low voltage fan at said opening, from outside said building, including
        attaching said fan to a screen fixed in said opening, whereby said fan is at least partially supported by said screen; and
    providing electrical power to said fan to move air through said opening.

* * * * *